(12) United States Patent
Wada et al.

(10) Patent No.: US 11,462,542 B2
(45) Date of Patent: Oct. 4, 2022

(54) SEMICONDUCTOR STORAGE DEVICE

(71) Applicant: KIOXIA CORPORATION, Tokyo (JP)

(72) Inventors: Masaharu Wada, Kanagawa (JP); Keiji Ikeda, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 219 days.

(21) Appl. No.: 16/803,786

(22) Filed: Feb. 27, 2020

(65) Prior Publication Data

US 2021/0082921 A1 Mar. 18, 2021

(30) Foreign Application Priority Data

Sep. 13, 2019 (JP) .............................. JP2019-167781

(51) Int. Cl.
| | |
|---|---|
| *H01L 27/108* | (2006.01) |
| *H01L 23/528* | (2006.01) |
| *H01L 29/78* | (2006.01) |
| *G11C 14/00* | (2006.01) |
| *H01L 29/10* | (2006.01) |
| *H01L 29/66* | (2006.01) |
| *H01L 29/24* | (2006.01) |

(52) U.S. Cl.
CPC .... *H01L 27/10805* (2013.01); *G11C 14/0009* (2013.01); *H01L 23/528* (2013.01); *H01L 27/108* (2013.01); *H01L 27/1085* (2013.01); *H01L 27/10873* (2013.01); *H01L 29/1037* (2013.01); *H01L 29/24* (2013.01); *H01L 29/66969* (2013.01); *H01L 29/7827* (2013.01)

(58) Field of Classification Search
CPC ... H01L 23/528; H01L 29/1037; H01L 29/24; H01L 29/66969; H01L 29/7827; H01L 29/7869; H01L 29/78642; H01L 27/10805; H01L 27/1085; H01L 27/10873; H01L 27/10814; H01L 27/10823; H01L 27/10852; H01L 27/10858; H01L 27/10891; H01L 27/10885; H01L 27/10897; H01L 27/108; G11C 14/0009

See application file for complete search history.

(56) References Cited

U.S. PATENT DOCUMENTS

| | | |
|---|---|---|
| 8,754,409 B2 | 6/2014 | Yamazaki et al. |
| 9,698,272 B1 * | 7/2017 | Ikeda .................. H01L 27/1255 |
| 10,079,238 B2 | 9/2018 | Matsubayashi |
| 2007/0037345 A1 | 2/2007 | Manger |

(Continued)

FOREIGN PATENT DOCUMENTS

JP 2013008768 A 1/2013

*Primary Examiner* — Galina G Yushina
(74) *Attorney, Agent, or Firm* — Kim & Stewart LLP

(57) ABSTRACT

According to one embodiment, a semiconductor storage device includes a plurality of first wires extending in a first direction, a plurality of second wires extending in a second direction intersecting the first direction, and a plurality of first semiconductor transistors. Each first semiconductor transistor is respectively connected between one of the plurality of first wires and one of the plurality of second wires. Each first semiconductor transistor includes a gate electrode connected to the respective first wire and a channel layer on a first surface of the second wire and also a side surface of the respective second wire.

19 Claims, 14 Drawing Sheets

(56) References Cited

U.S. PATENT DOCUMENTS

| | | | |
|---|---|---|---|
| 2012/0168843 A1* | 7/2012 | Seo | H01L 27/10876 |
| | | | 438/266 |
| 2019/0221567 A1 | 7/2019 | Sandhu | |
| 2019/0296155 A1* | 9/2019 | Sawabe | H01L 29/7869 |
| 2020/0303554 A1* | 9/2020 | Sawabe | H01L 29/42392 |

* cited by examiner

SEMICONDUCTOR STORAGE DEVICE

This application is based upon and claims the benefit of priority from Japanese Patent Application No. 2019-167781, filed Sep. 13, 2019, the entire contents of which are incorporated herein by reference.

FIELD

Embodiments described herein relate generally to a semiconductor storage device.

BACKGROUND

A semiconductor storage device having bit lines, word lines, and memory cells (comprising transistors and capacitors) connected to the bit lines and the word lines is known. By selecting one bit line and one word line and then applying a voltage it is possible to write data to and read data from each memory cell.

As semiconductor storage devices become ever denser, the bit lines must generally become narrower as well. Owing to this, the electrical resistance between a bit line and a transistor to which it connects will increase, which possibly limits the operating speed of the semiconductor storage device.

DETAILED DESCRIPTION

At least one embodiment provides a semiconductor storage device that can achieve a reduction in the resistance between a bit line and a transistor.

In general, according to one embodiment, a semiconductor storage device comprises a plurality of first wires extending in a first direction, a plurality of second wires extending in a second direction that intersects the first direction, and a plurality of first semiconductor transistors connected therebetween. Each first semiconductor transistor is respectively connected to one of the plurality of first wires and one of the plurality of second wires. Each first semiconductor transistor includes a gate electrode connected to the respective first wire and a channel layer on a first surface of the second wire and also a side surface of the respective second wire.

Example embodiments of the present disclosure will be described with reference to the drawings.

Figure 1:
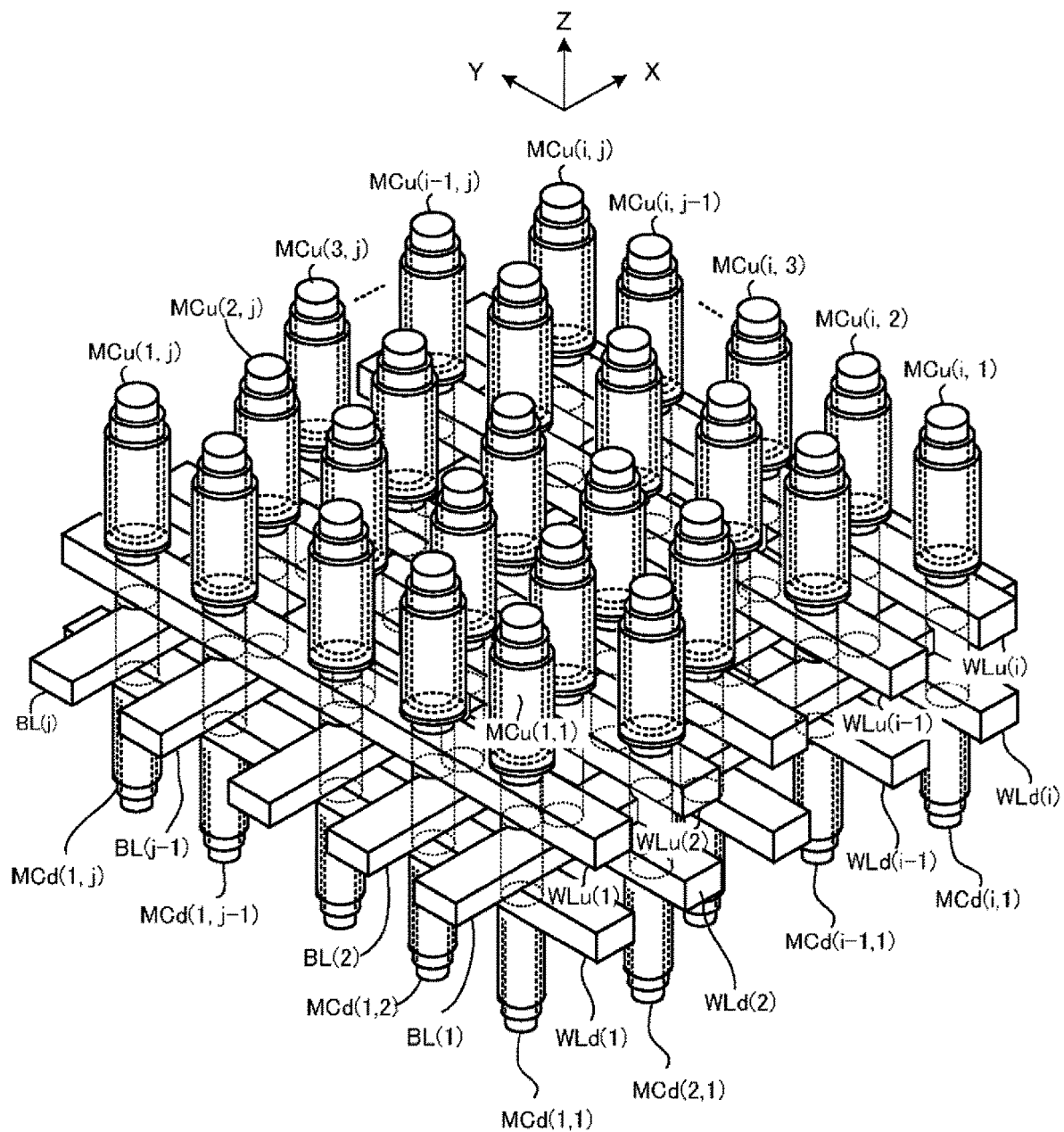
FIG. 1 is a perspective view schematically depicting a semiconductor storage device according to an embodiment.

FIG. 1 is a perspective view schematically depicting a semiconductor storage device according to an embodiment.

This semiconductor storage device has bit lines BLs, word lines WLs (WLu, WLd), and memory cells MCs (MCu, MCd).

The bit lines BL(1) to BL(j) (where j is an integer) along an X-axis direction (an example of a second direction) are disposed along a Y-axis direction (an example of the first direction). Each bit line BL has an upper surface (an example of a first surface) facing a positive Z-axis direction (an example of a third direction different from the first and second directions), a lower surface (an example of a fourth surface opposite to the first surface) facing a negative Z-axis direction, and two side surfaces (an example of second and third surfaces) facing positive and negative Y-axis directions (an example of a fourth direction different from the second and third directions and an opposite direction to the fourth direction).

The word lines WLu(1) to WLu(i) and word lines WLd(1) to WLd(i) (where i is an integer) along the Y-axis direction are disposed on upper and lower sides of the bit lines BLs (in positive and negative Z-axis directions) to align in the X-axis direction.

Memory cells MCu(i,j) and MCd(i,j) are disposed above a point of intersection between the bit line BL(j) and the word line WLu(i), and below a point of intersection between the bit line BL(j) and the word line WLd(i), respectively.

As described later, each of the memory cells MCu(i,j) and MCd(i,j) is connected to an upper or lower surface and one of the side surfaces of the bit line BL(j). The bit ling BL(j) has a notched side surface portions conforming to the shape of the memory cell MC connected thereto. As a result, a reduction in a contact resistance between each memory cell MC and each bit line BL can be achieved by an increase in contact area.

Figure 2:
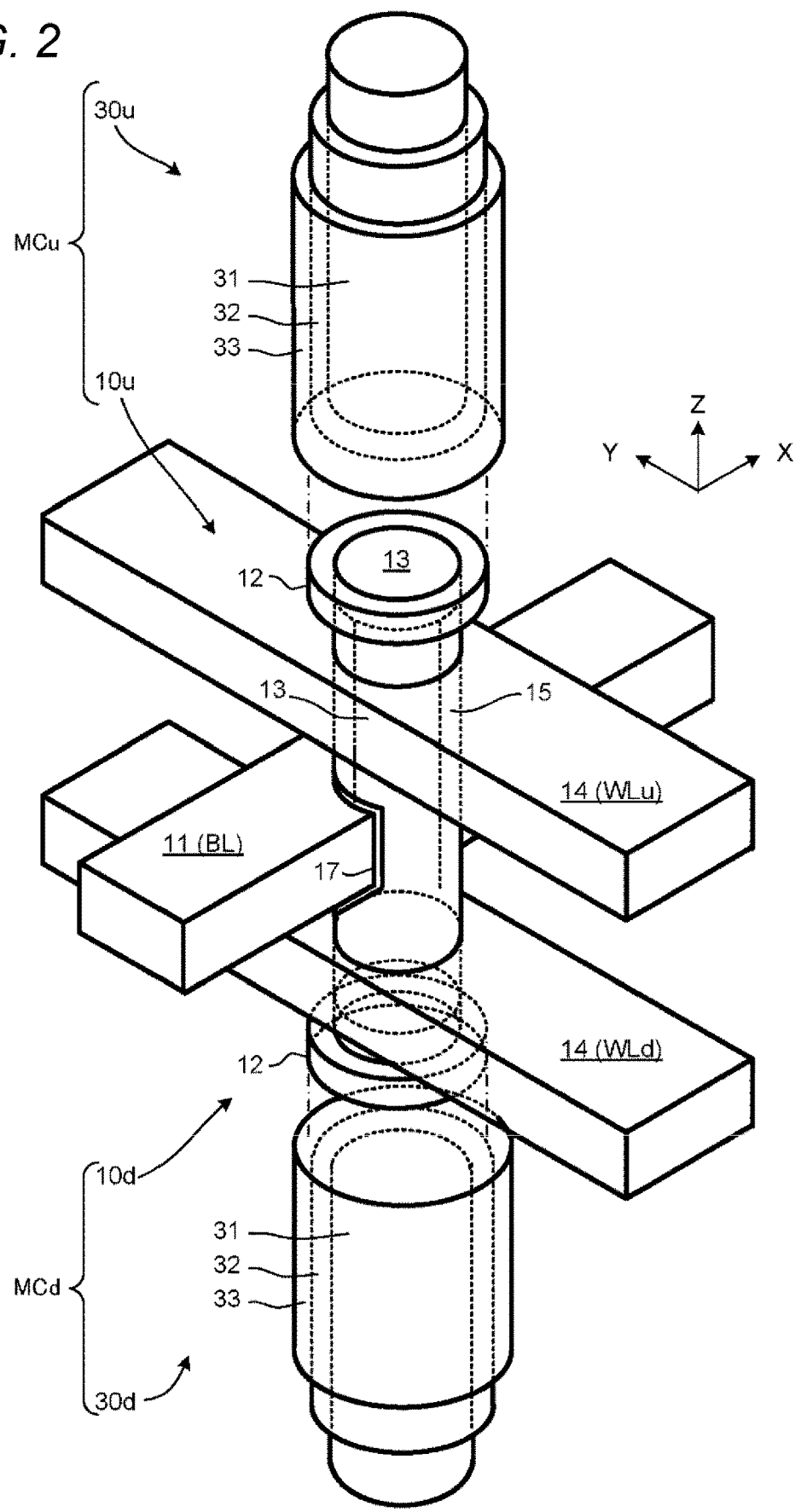
FIG. 2 is a perspective view schematically depicting memory cells.
Figure 3:
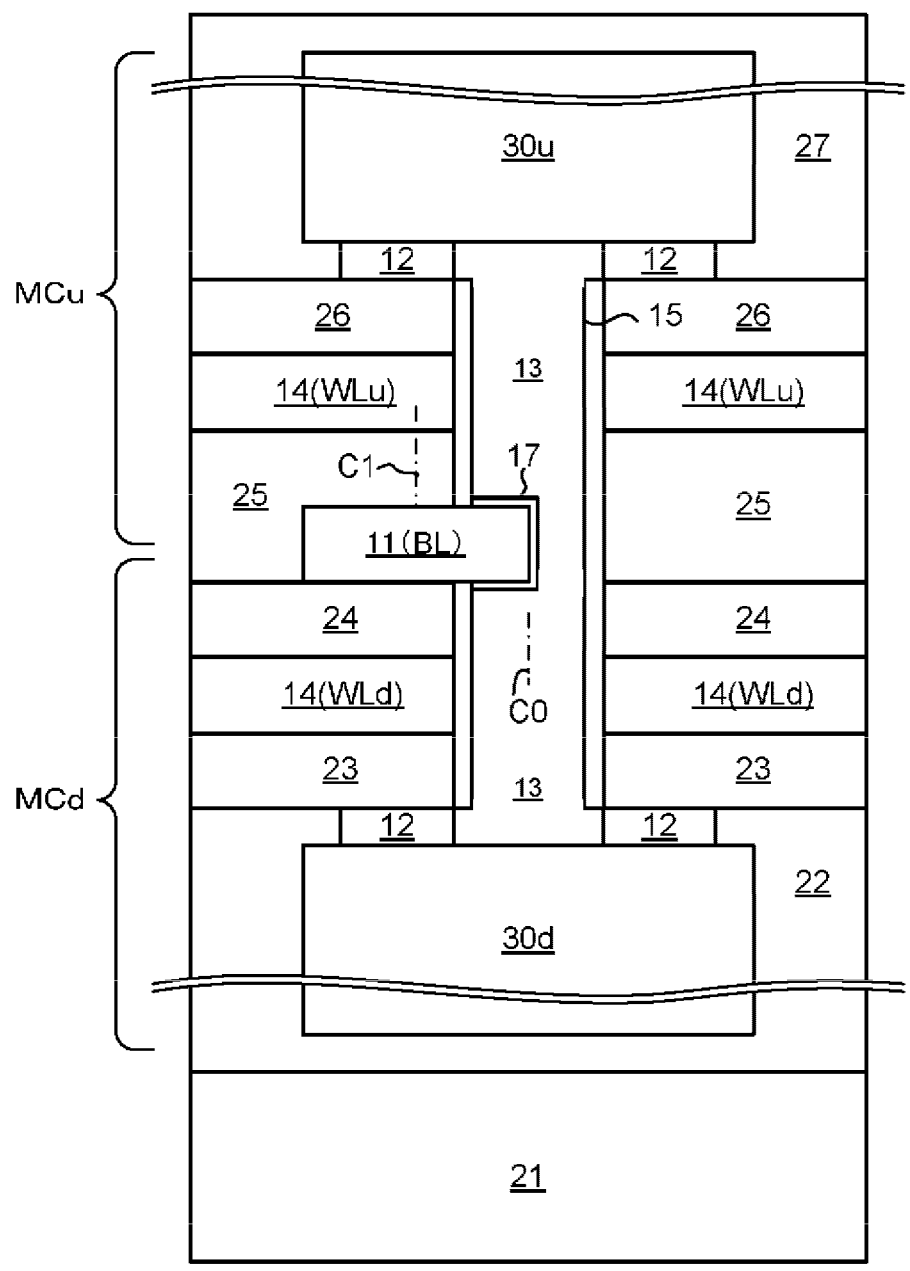
FIG. 3 is a cross-sectional view schematically depicting memory cells.
Figure 3:
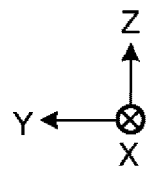

FIG. 2 is a perspective view depicting the memory cells MCs (MCu, MCd) connected to the bit line BL and the word lines WLs (WLu, WLd). FIG. 3 is a cross-sectional view schematically depicting the memory cells MCs (MCu, MCd).

The memory cells MCs (MCu, MCd) are configured such that transistors 10 (10u, 10d) are connected to capacitors 30 (30u, 30d).

In FIG. 2, each transistor 10 and the corresponding capacitor 30 are depicted to be apart from the other in a partially exploded view and the substrate 21 and interlayer insulating layers 22 to 27 (see FIG. 3) are not depicted.

The transistors 10u and 10d are oxide semiconductor transistors disposed on upper and lower sides, respectively, and each of the transistors 10u and 10d is an oxide semiconductor transistor that has an semiconductor oxide serving as a channel layer 13, and is a so-called surrounding gate transistor (SGT) that has a gate electrode 14 surrounding the channel layer 13. Each transistor 10 is a so-called vertical transistor that has a source electrode 11, a gate electrode 14, and a drain electrode 12 disposed in a thickness direction (Z direction) of the substrate 21.

Each of the capacitors 30 (30u, 30d) comprises a cell electrode 31, an insulating film 32, and a plate electrode 33. The cell electrode 31 is connected to the drain electrode 12 of a transistor 10. Charges are accumulated and stored in the capacitor 30 by causing the connected transistor 10 to operate as a switching transistor of a Dynamic Random Access Memory (DRAM) or the like.

Each of the transistors 10 (10u, 10d) has a bit line BL (source electrode 11), a drain electrode 12, a channel layer (semiconductor oxide layer) 13, a gate electrodes 14 (word lines WL (WLu, WLd)), a gate insulating layer 15, and an oxide layer 17.

Each of the source electrodes 11 and the drain electrodes 12 may be formed from a conductive material (for example, metal, a metallic compound, a doped semiconductor, or conductive oxide). Each of the source electrodes 11 and the drain electrodes 12 may be formed from a composite material, for example, a stacked structure of metal and conductive oxide or a stacked structure of tungsten (W) and indium tin oxide (ITO). For example, a channel layer 13—side surface of each of the source electrode 11 and the drain electrode 12 may be formed from indium tin oxide (ITO).

The source electrode 11 is a part of a bit line BL.

The drain electrode 12 is connected to the cell electrode 31 of the capacitor 30. Charges are injected into the capacitor 30 by feeding a current from the drain electrode 12 to the capacitor 30.

The channel layer 13 can electrically connect the source electrode 11 to the drain electrode 12. When the transistor 10 is turned on, a channel that acts as a current path is formed in the channel layer 13.

The channel layer 13 is a semiconductor oxide material and contains, for example, indium (In). The channel layer 13 may contain, for example, indium and gallium oxide, indium and zinc oxide, or indium and tin oxide. As an example, the channel layer 13 may be so-called IGZO (InGaZnO) containing indium, gallium, and zinc (indium-gallium-zinc oxide).

The gate electrodes 14 are each disposed between the source electrode 11 and the drain electrode 12 to be insulated from the source electrode 11, and the drain electrode 12 and constitutes part of a word line WL.

The gate electrode 14 is, for example, metal, a metallic compound, or a semiconductor. The gate electrode 14 is, for example, any of tungsten (W), titanium (Ti), titanium nitride (TiN), molybdenum (Mo), cobalt (Co), and ruthenium (Ru).

The gate insulating layer 15 surrounds an outer periphery of the channel layer 13. The gate insulating layer 15 is, for example, an oxide or oxynitride (for example, silicon oxide).

The oxide layer 17 is disposed between the channel layer 13 and the source electrode 11 (bit line BL) and intended to reduce a connection resistance between the channel layer 13 and the source electrode 11.

The channel layer 13 is semiconductor oxide material and thus contains oxygen. Owing to this, oxygen in the channel layer 13 often will bond with metal in the source electrode 11 (bit line BL) and a high-resistance metal oxide layer can be often be formed at an interface between the channel layer 13 and the source electrode 11. The oxide layer 17 in this example functions as a barrier layer that prevents the reaction between oxygen from the channel layer 13 and metal in the source electrode 11 (bit line BL), and prevents formation of the high-resistance metal oxide layer.

When the channel layer 13 is indium-gallium-zinc oxide (IGZO), any of indium-gallium-silicon oxide (for example, InGaSiO) and gallium oxide (for example, Ga2O3), may be selected as the oxide layer 17.

The substrate 21 is a semiconductor substrate, for example, a silicon substrate.

The interlayer insulating layers 22 to 27 are, for example, oxide (silicon oxide, for example) and each electrically isolates upper and lower layers.

Figure 4:
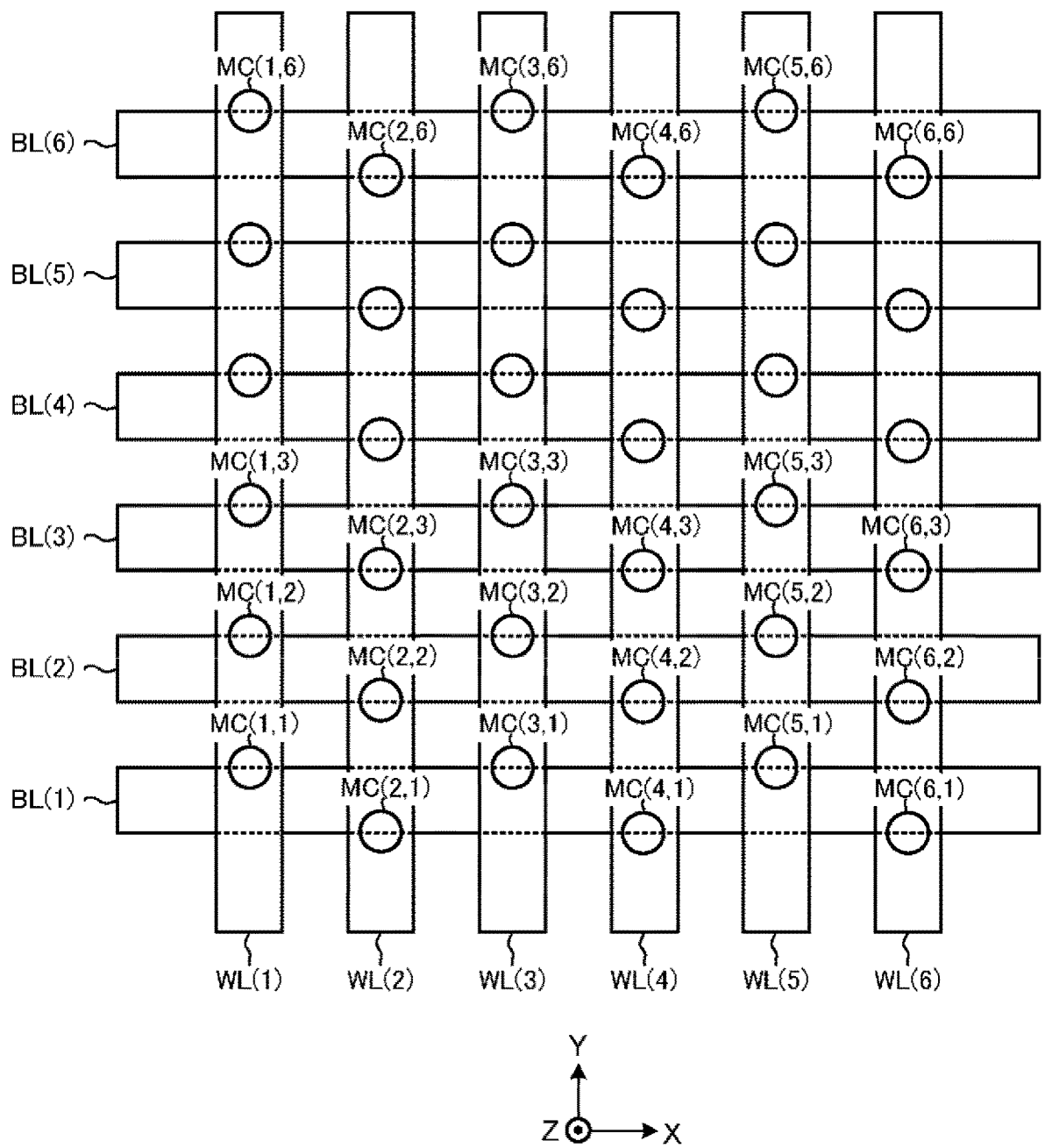
FIG. 4 is a top view schematically depicting placement of memory cells according to the embodiment.

FIG. 4 depicts a positional relationship among the memory cells MCs (channel layers 13), the bit lines BLs (source electrodes 11), and the word lines WLs (gate electrodes 14) on an XY plane.

In FIG. 4, the memory cells MCu(i,j) and MCd(i,j) are disposed on the upper and lower sides along the Z-axis as shown in FIGS. 1 to 3. It is noted, however, the memory cells MCu(i,j) and MCd(i,j) may instead be disposed on the XY plane in a staggered fashion as will be described later. This respect similarly applies to FIGS. 6 and 7.

As shown in FIGS. 2 to 4, each memory cell MC (more particularly the channel layer 13 thereof) is disposed near a centerline of a word line WL (gate electrode 14) in the width direction (X-direction) of the respective word line WL.

On the other hand, the memory cell MC (channel layer 13) is disposed near an edge (side surface) of the bit line BL (source electrode 11). That is, a central axis C0 of the channel layer 13 does not match a central axis C1 of the bit line BL but rather is offset therefrom in the width direction (Y-direction) of the respective bit line BL to be disposed near a side (also referred to as an edge) of the respective bit line BL.

Therefore, the memory cell MC (channel layer 13) can be connected to the upper or lower surface of the bit line BL in addition to one of the side surfaces of the bit line BL (source electrode 11) via the oxide layer 17. Owing to this, the contact area between these elements can be increased and thus a reduction in the connection resistance can be achieved between the channel layer 13 and the bit line BL. This can help increase the potential operating speed of the semiconductor storage device.

Here, as shown in FIG. 4, the memory cells MCs are alternately disposed on two opposed side surfaces of each bit line BL (that is, along two edges in positive and negative Y-axis directions) along each bit line BL length. Along each word line WL length, the memory cells MC are disposed only on the same side/edge of the different bit lines BL. That is, the memory cells MC are disposed only on the positive Y-axis direction side surfaces of the bit lines BL for those memory cells MC connected to the odd-numbered word lines WL(1), WL(3), and WL(5), etc., while the memory cells MCs are disposed only on the negative Y-axis direction side surfaces of the bit lines BL for those memory cells MC connected to the even-numbered word lines WL(2), WL(4), WL(6), etc.

Staggering the memory cells MCs between the different edges of each bit line BL along the length of the bit lines BL makes it possible to maintain a distance between adjacent memory cells MC on the same bit line BL. For example, when all the memory cells MCs are disposed on the same side of each bit line BL in the positive Y-axis direction, then the distance between the memory cells MCs (for example, memory cells MC(1, 1) and MC(2,1) adjacent in the X-axis direction would be less than that which occurs when the memory cells MCs are disposed as shown in FIG. 4.

In this way, by increasing the distance between the adjacent memory cells MC on each bit line BL, it possible to reduce capacitive coupling between the memory cells MC. Increased coupling between the memory cells MC possibly affects (or interferes with) the adjacent memory cell MC when data is written to the memory cell MC.

It is noted, however, that it may not always be necessary to increase the distance between the adjacent memory cells MC in all cases, but, in any event, it is still similarly possible to reduce the connection resistance by adopting the above-described configuration.

Comparison Example

Figure 5:
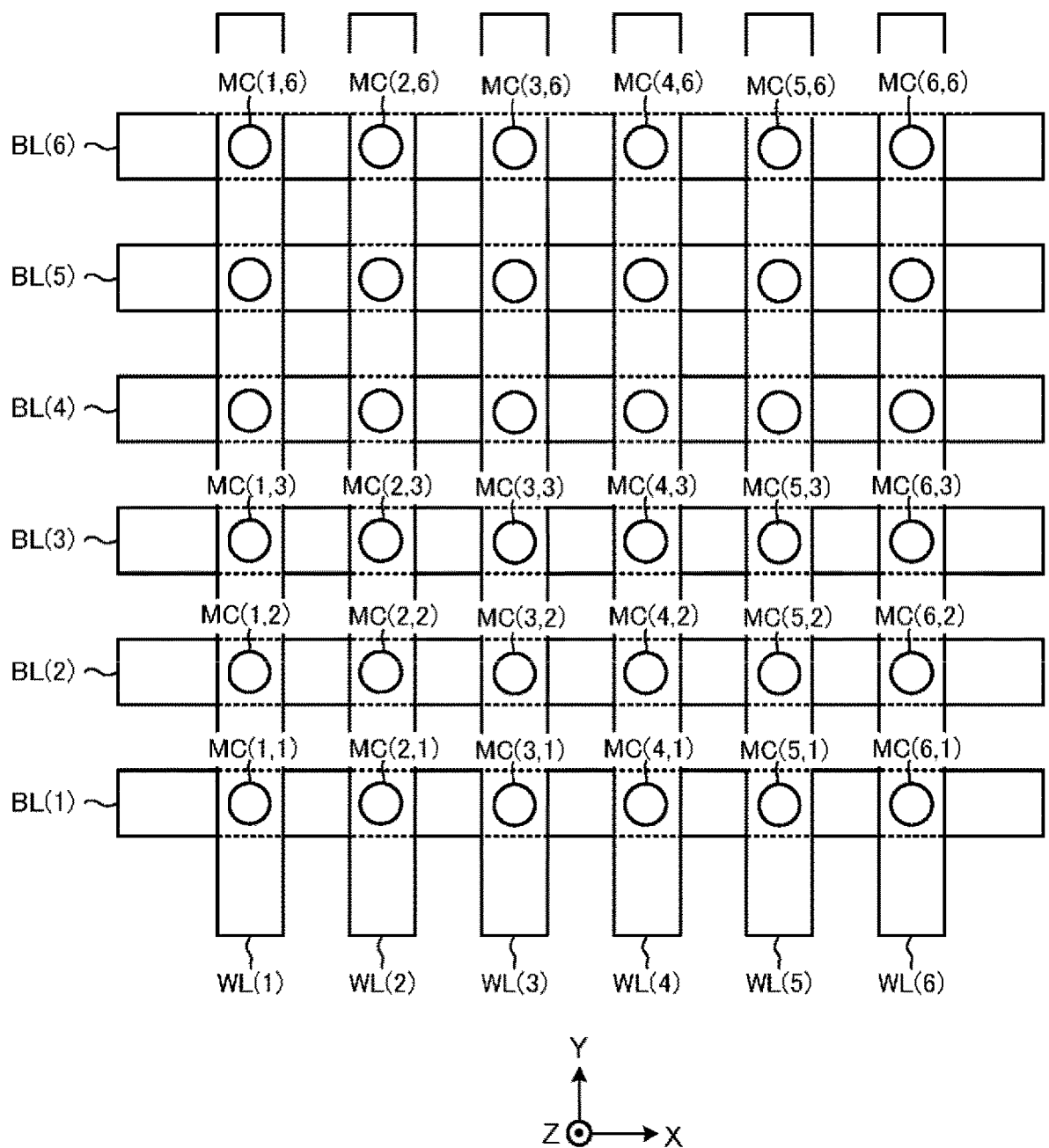
FIG. 5 is a top view schematically depicting placement of memory cells according to a comparison example.

FIG. 5 depicts placement of memory cells MC according to a comparison example.

The memory cells MCs (MCu, MCd) (channel layers 13) are disposed near a center of each bit line BL (source electrode 11) and connected only to an upper or lower surface of the bit line BL. The contact area between each channel layer 13 and bit line BL appears to be larger than that in the case depicted in FIG. 4. However, since channel layer 13 in this comparison example does not contact a side surface of the bit line BL, the overall contact area is actually smaller (or at least less than could otherwise be achieved) and therefore the connection resistance will be higher than in the case depicted in FIG. 4.

In a case in which the oxide layer 17 is not present, then the metal oxide layer can be possibly formed at the interface between the channel layer 13 and the bit line BL and the connection resistance is possibly further increased.

(First Modification)

Figure 6:
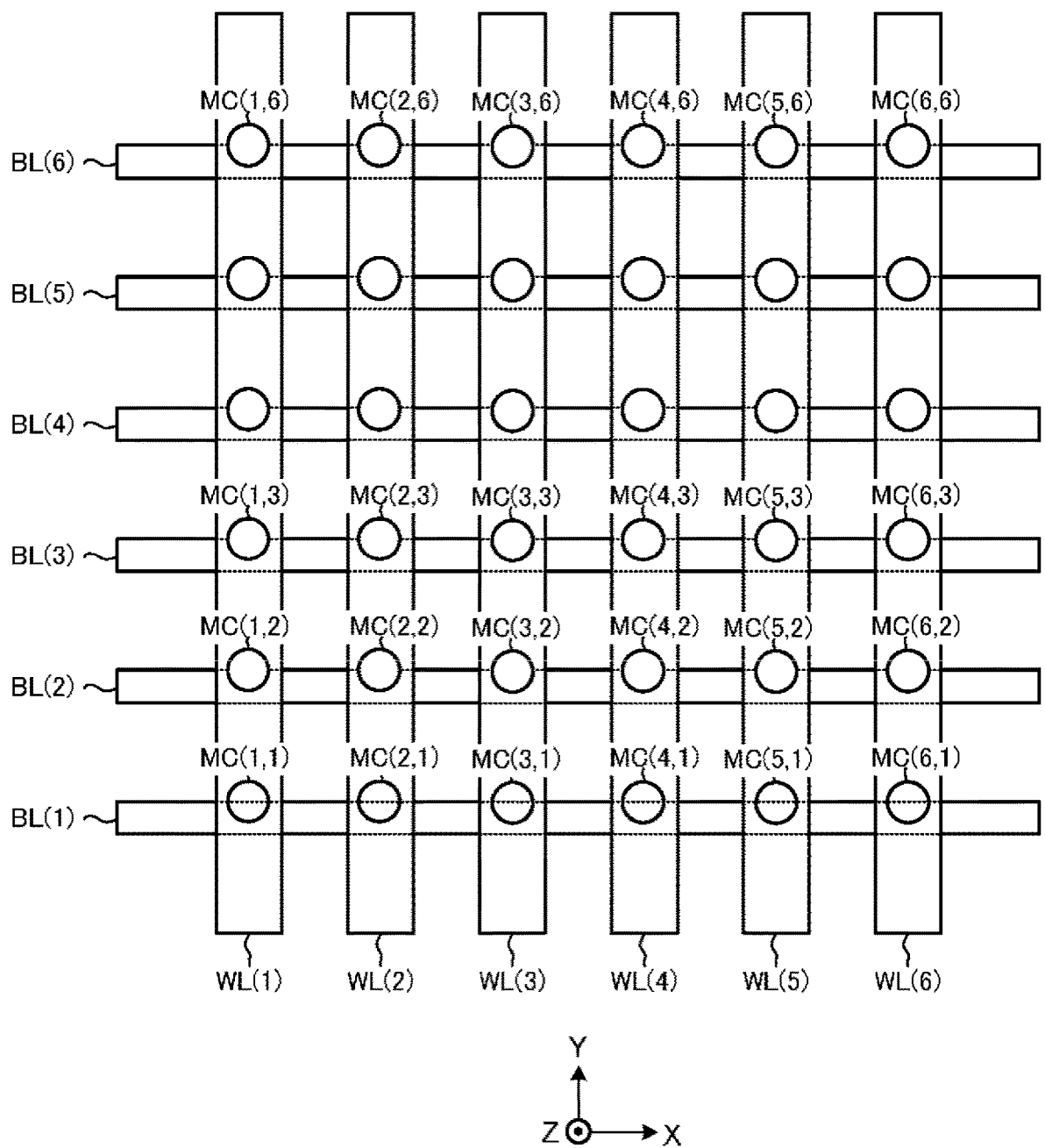
FIG. 6 is a top view schematically depicting placement of memory cells according to a first modification.

FIG. 6 depicts placement of memory cells MC according to a first modification.

In the first modification, the memory cells MC are disposed only along the side in the positive Y-axis direction of each bit line BL (source electrode 11). In this case, the contact area between the channel layer 13 and the bit line BL may be the same as that in the case of FIG. 4, though the distance between adjacent memory cells MC on each bit line is less than the case of FIG. 4.

While the width of each bit line BL in FIG. 6 is less than that in FIG. 4, the reduction in bit line BL width does not reduce the contact area between channel layer 13 and the bit line BL. In this way, it is possible to achieve a reduction in the width of the bit lines BL without an increase in contact resistance.

(Second Modification)

Figure 7:
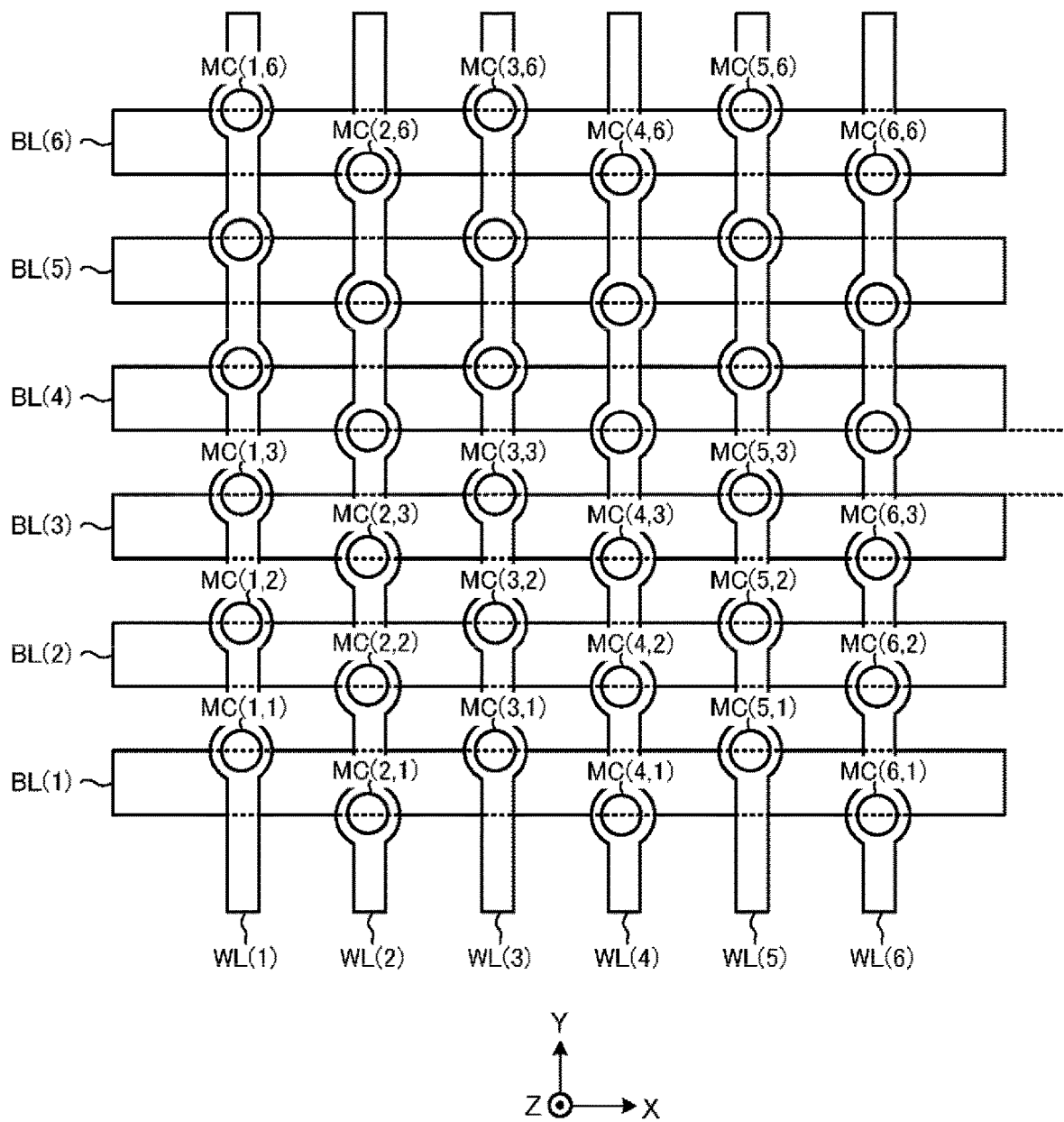
FIG. 7 is a top view schematically depicting placement of memory cells according to a second modification.

FIG. 7 depicts placement of memory cells MC according to a second modification.

While the placement of the memory cells MC is similar to that in FIG. 4, the width of each word line WL is not uniform. That is, the width of the word line WL is large where each memory cell MC (channel layer 13) is disposed (forming a generally circular portion), while the width of the word line WL is less where no memory cell MC is disposed (forming a generally rectangular portion).

The distance between adjacent word lines WL is greater. As a result, the capacitive coupling between the adjacent memory cells MC is reduced.

(Third Modification)

Figure 8:
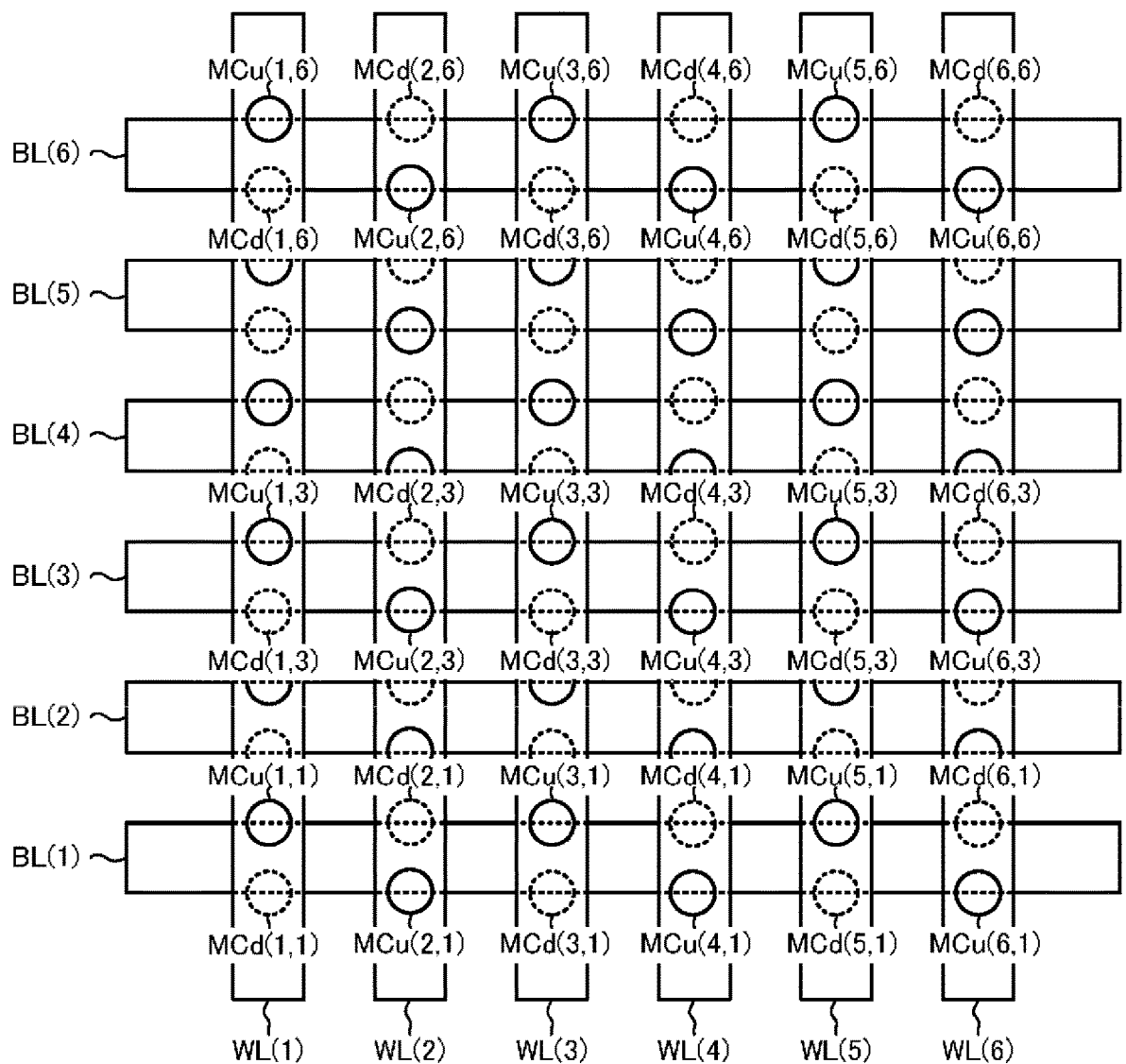
FIG. 8 is a top view schematically depicting placement of memory cells according to a third modification.

FIG. 8 depicts placement of memory cells MC according to a third modification.

In the third modification, the memory cells MCs (MCu, MCd) are disposed in a staggered fashion, but the staggering is different for the upper memory cells MCu and the lower memory cells MCd. That is, the channel layers 13 of transistors 10u(i,j) and 10d(i,j) disposed on the upper and lower sides are connected to the opposed side surfaces of the respective bit line BL. That is, the channel layer 13 of the transistor 10u(i,j) is not directly aligned (or connected) to the channel layer 13 of the transistor 10d(i,j). The channel layer 13 of transistor 10u(i,j) is connected to one edge surface (+/−Y-direction side surface) of the bit line BL(j) and the channel layer 13 of transistor 10d(i,j) is connected to the other edge surface (−/+Y-direction side surface) of the bit line BL(j).

In this case, similarly to the above examples, each of the memory cells MCs (MCu, MCd) is connected to the upper or lower surface of a bit line BL along with one of the side surfaces of the bit line BL and thus the contact area can be maintained/increased.

In the third modification, each memory cell MCu (i,j) is disposed similarly to that in FIG. 4, and the memory cell MCd(i,j) is disposed on the side surface of the bit line BL(j) opposite to the side surface of the bit line BL(j) on which the memory cell MCu(i,j) is disposed.

In the embodiment and the first and second modifications, the channel layers 13 of the transistors 10u(i,j) and 10d(i,j) disposed on the upper and lower sides are connected to the same side surface of the bit line BL(j). That is, the channel layer 13 of the transistor 10u(i,j) is directly connected/aligned to the channel layer 13 of the transistor 10d(i,j).

It is noted, however, that as, in the third modification, the channel layers 13 of the transistors 10u(i,j) and 10d(i,j) may be connected to opposite side surfaces of the bit line BL(j). That is, the channel layer 13 of the transistor 10u(i,j) need not be directly connected to the channel layer 13 of the transistor 10d(i,j).

(Manufacturing Method)

Figure 9:
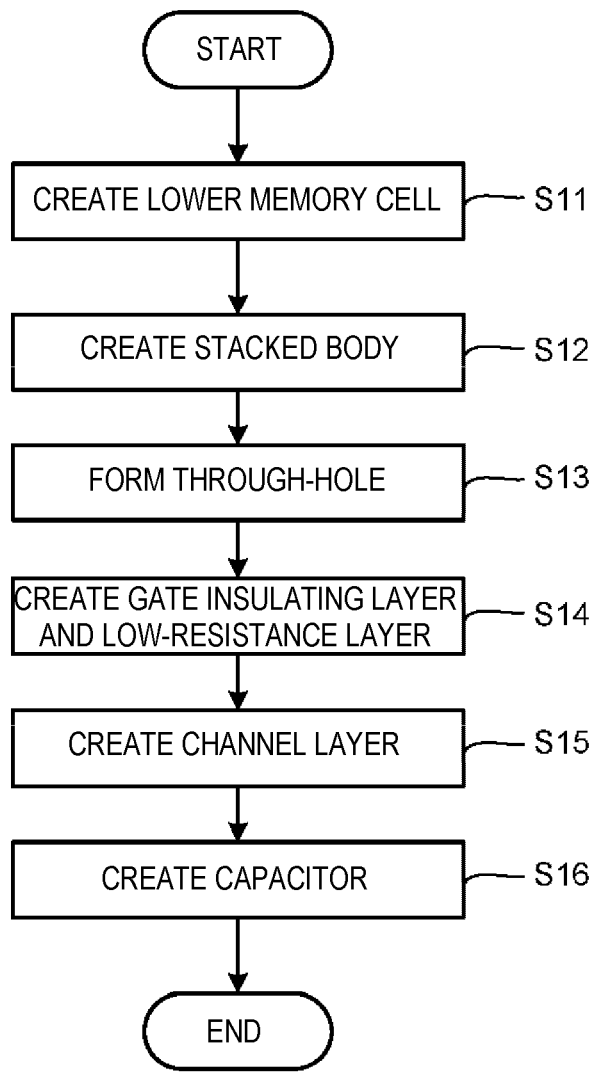
FIG. 9 is a flowchart depicting an example of processes of manufacturing a semiconductor storage device.

FIG. 9 is a flowchart showing an example of processing in the manufacturing of a semiconductor storage device. FIGS. 10 to 14 are schematic cross-sectional views for explaining the method of manufacturing a semiconductor storage device in an embodiment.

Figure 10:
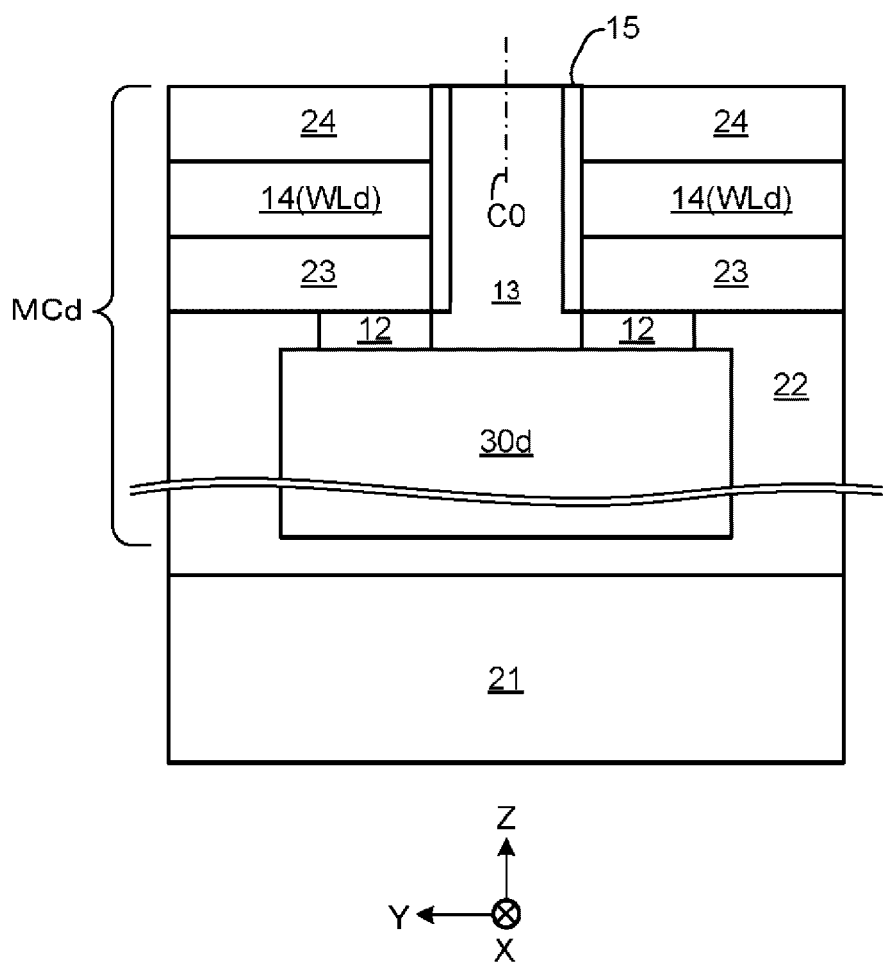
FIG. 10 is a cross-sectional view schematically depicting a semiconductor storage device during a manufacturing process.

(1) Create Lower Memory Cell MCd (Step S11, FIG. 10)

Each memory cell MCd is created. The capacitor 30d, the transistor 10d (the drain electrode 12, the word line WLd, the channel layer 13, and the gate insulating layer 15), and the interlayer insulating layers 22 to 24 are created on the substrate 21.

At this stage, the source electrode 11 (bit line BL) is not yet created.

Since this process can be carried out similarly to that in the creation of a conventional semiconductor storage device, detailed description of this processing is omitted.

It is noted, however, that the axis C0 of the channel layers 13 is deviated from the axis C1 of the bit lines BL.

Figure 11:
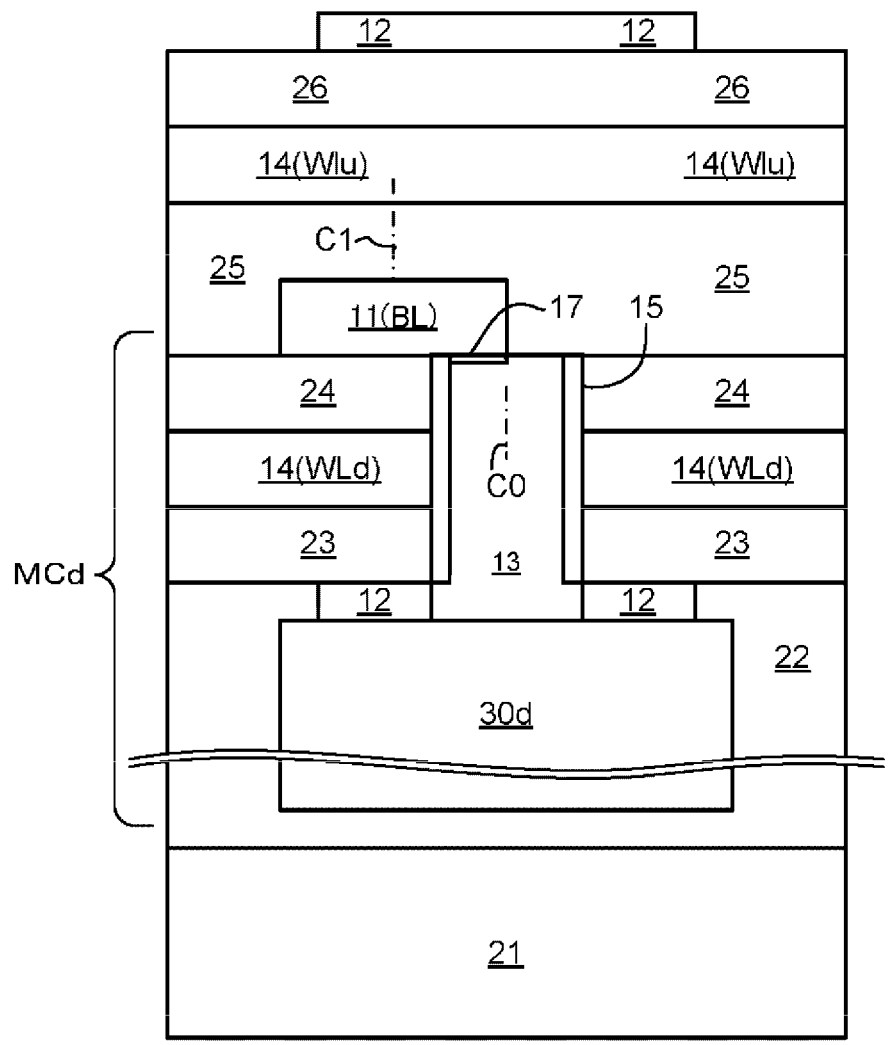
FIG. 11 is a cross-sectional view schematically depicting a semiconductor storage device during a manufacturing process.

(2) Create Stacked Body (Step S12, FIG. 11)

A stacked body is created. That is, the oxide layer 17, the bit line BL (source electrode 11), the interlayer insulating layer 25, the word line WLu (gate electrode 14), the interlayer insulating layer 26, and the drain electrode 12 are created on the interlayer insulating layer 24 in this order.

At this time, the oxide layer 17 (or a portion of what will become the oxide layer 17) has been created before the bit line BL (source electrode 11), but the oxide layer 17 is eventually disposed on the lower surface of the bit line BL.

Figure 12:
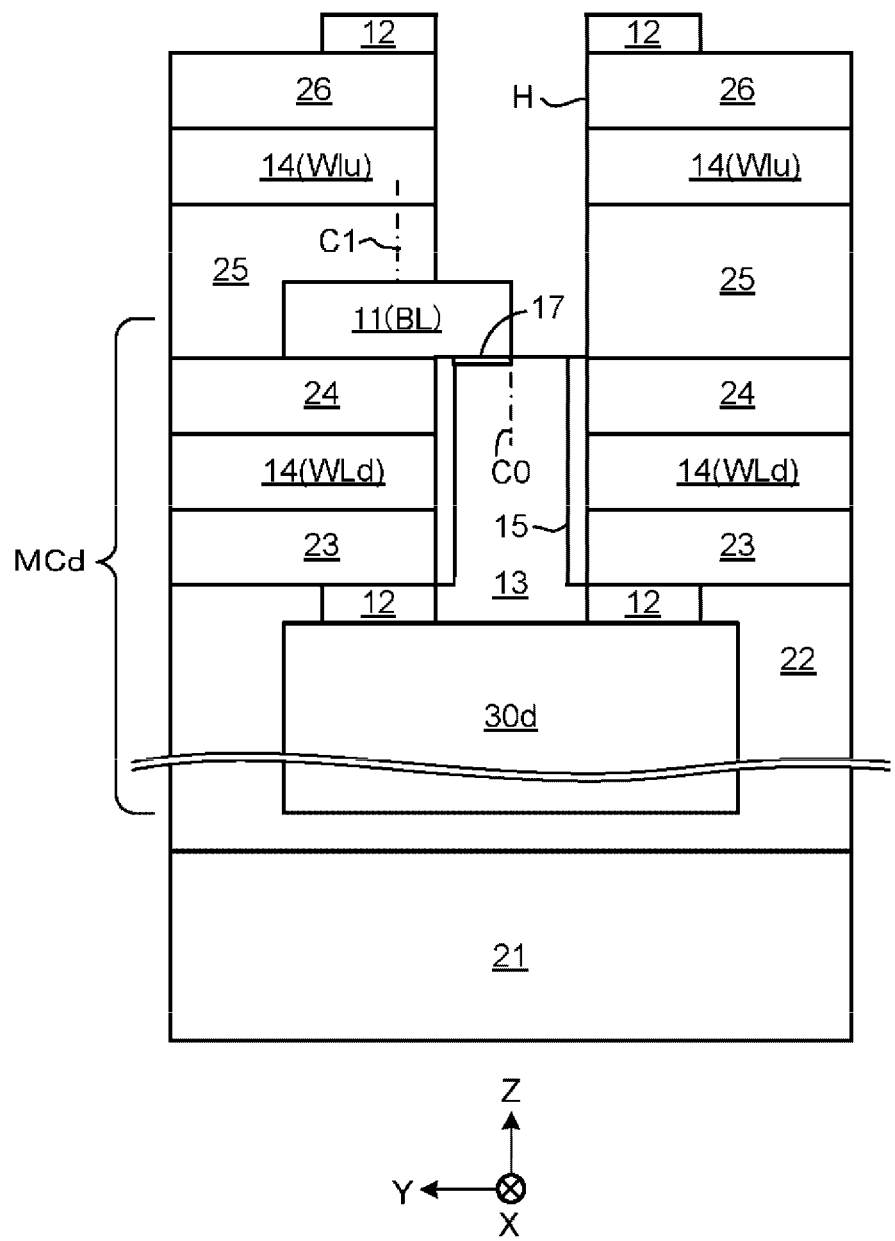
FIG. 12 is a cross-sectional view schematically depicting a semiconductor storage device during a manufacturing process.

(3) Form Through-Hole H (Step S13, FIG. 12)

A through-hole H is formed in the stacked body (see FIG. 12). That is, the through-hole H that penetrates the drain electrode 12, the interlayer insulating layer 26, the gate electrode 14, and the interlayer insulating layer 25 and that reaches the bit line BL (source electrode 11) is formed.

The axis C0 of the through-hole H is along the side/edge of the bit line BL (source electrode 11) and the side surface of the bit line BL is exposed within the through-hole H. Both the interlayer insulating layer 25 and the bit line BL are etched in this processing. However, because of differences in etching rates of the interlayer insulating layer 25 and the bit line BL (the etching rate of the interlayer insulating layer 25 is generally higher, the bit line BL is not substantially etched. This results in exposure of the upper surface and one of the side surfaces of the bit line BL in the through-hole H.

Figure 13:
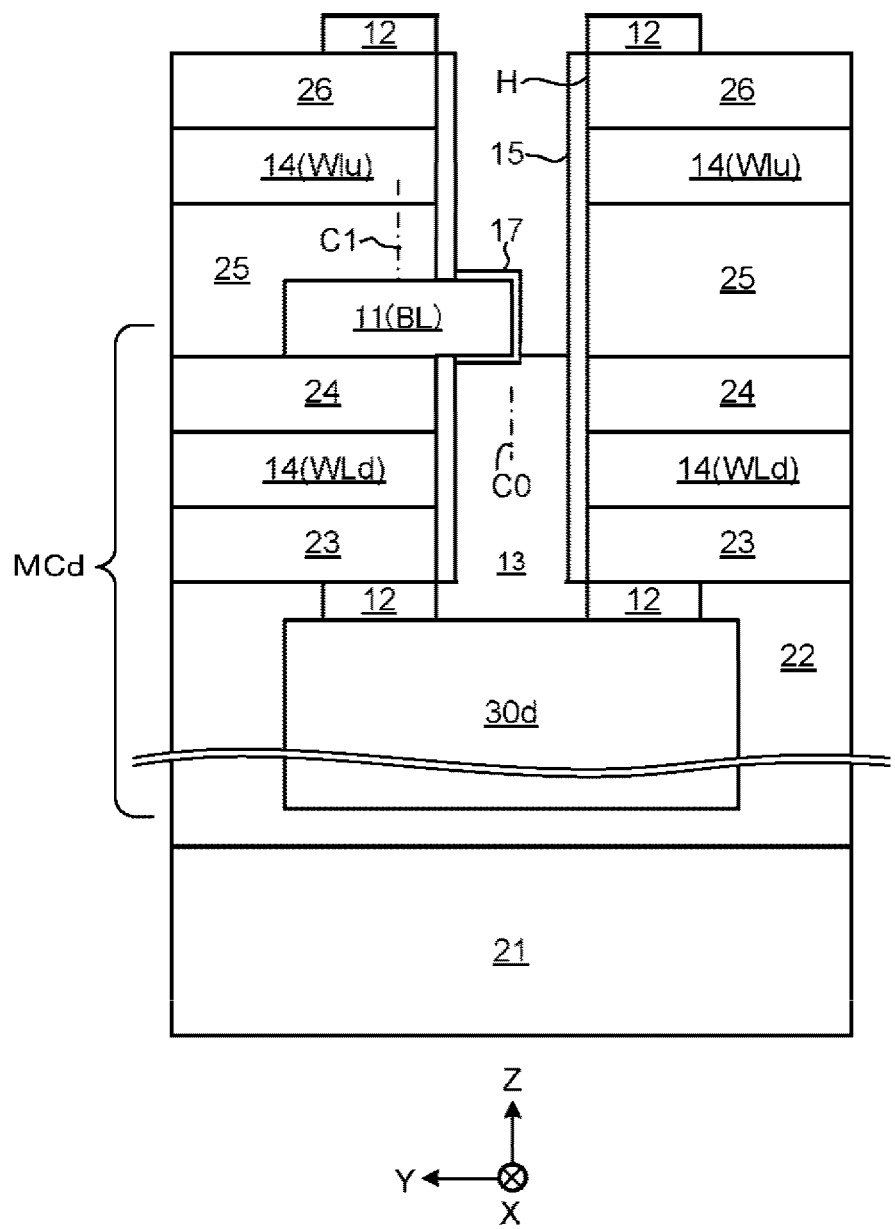
FIG. 13 is a cross-sectional view schematically depicting a semiconductor storage device during a manufacturing process.

(4) Create Gate Insulating Layer 15 and Oxide Layer 17 (Low-Resistance Layer) (Step S14, FIG. 13)

Next, the gate insulating layer 15 is formed. The memory cell MCu-side gate insulating layer 15 to be deposited at this time is connected to the memory cell MCd-side gate insulating layer 15.

Furthermore, the oxide layer 17 is now fully formed. In this processing, the oxide layer 17 is formed on the upper surface and the side surface of the bit line BL (source electrode 11). As a result, the oxide layer 17 (including the portion previously formed in Step S12) is disposed on the exposed upper, lower, and side surface of the bit line BL.

As already described, the oxide layer 17 prevents the formation of the high-resistance metal oxide layer at the interface between the channel layer 13 and the source electrode (bit line BL). As a result, an increase in a resistance between the channel layer 13 and the source electrode 11 is prevented.

Figure 14:
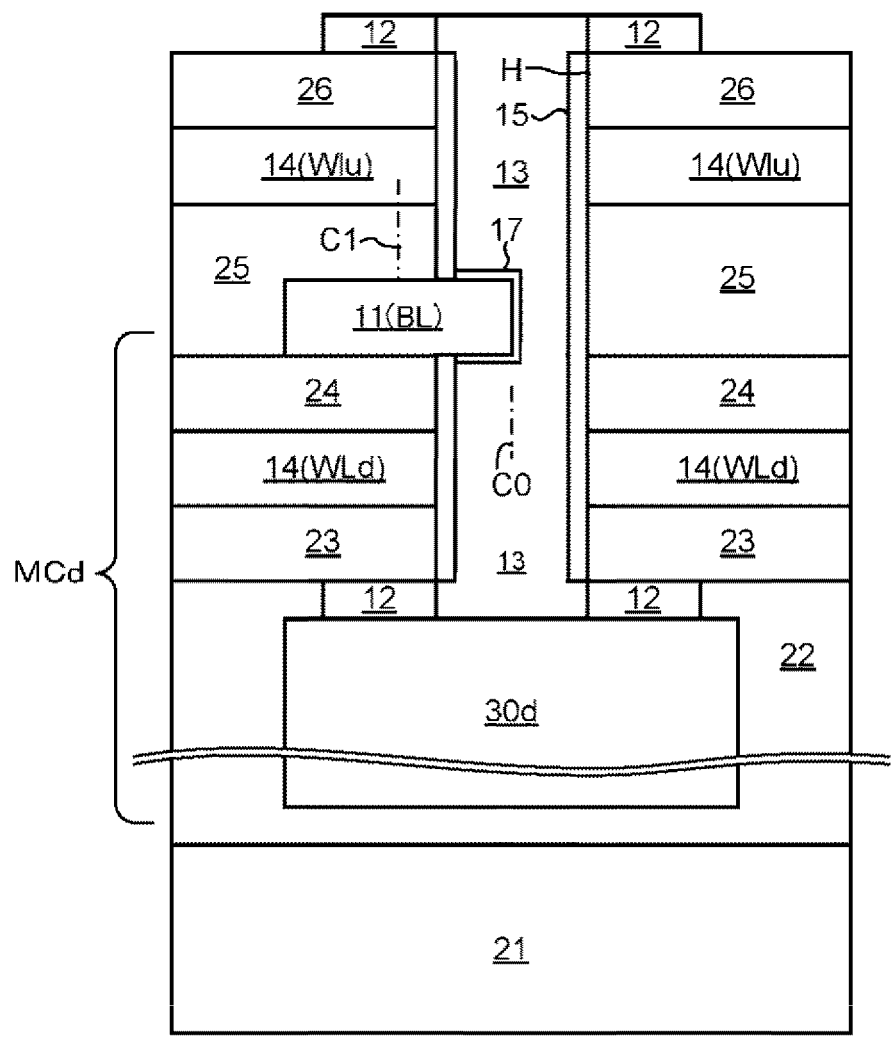
FIG. 14 is a cross-sectional view schematically depicting a semiconductor storage device during a manufacturing process.

(5) Create Channel Layer 13 (Step S15, FIG. 14)

The through-hole H is filled with the channel layer 13 (see FIG. 14). The memory cell MCu-side channel layer 13 is connected to the memory cell MCd-side channel layer 13.

(6) Create Capacitor 30u (Step S16, FIG. 3)

The capacitor 30u (see FIG. 3) and the interlayer insulating layer 27 are formed.

Through these procedures, the semiconductor storage device shown in FIGS. 1 to 4 can be created.

In the embodiments described above, the memory cells MCs (MCu, MCd) are disposed on the upper and lower sides, respectively. For the semiconductor storage device in the embodiment to have a configuration such that the memory cells MCs (MCu, MCd) are staggered on the XY plane as described in the third modification, then two opposed side surfaces of the bit line BL must be exposed and the respective channel layers 13 of the memory cells MCu, MCd may then be disposed on the two opposed side surfaces, respectively.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
a plurality of first wires extending in a first direction;
a plurality of second wires extending in a second direction intersecting the first direction; and
a plurality of first semiconductor transistors, each of the first semiconductor transistors connected to a corresponding one of the plurality of first wires and a corresponding one of the plurality of second wires, each of the first semiconductor transistors including a gate electrode connected to the corresponding one of the first wires and a channel layer connected to a first surface and a side surface of the corresponding one of the second wires through a conductive layer, the first surface facing in a third direction intersecting the first and second directions and the side surface facing in a direction intersecting the third direction.

2. The semiconductor memory device according to claim 1, wherein the first semiconductor transistors that are connected to a same second wire and adjacent to each other along the same second wire have channels that are on different side surfaces of the second wire.

3. The semiconductor storage device according to claim 1, further comprising:
a plurality of third wires extending in the first direction and spaced from the plurality of first wires in the third direction; and
a plurality of second semiconductor transistors, each of the second semiconductor transistor connected to a corresponding one of the plurality of third wires and a corresponding one of the plurality of second wires, wherein
the plurality of second wires are between the plurality of first wires and the plurality of third wires in the third direction, and
channel layers of the plurality of first semiconductor transistors and channel layers of the plurality of second semiconductor transistors that are connected to a same second wire are aligned with each other in the third direction.

4. The semiconductor storage device according claim 1, wherein
the conductive layer is an oxide layer between each of the second wires and the channel layer,
the channel layer includes a semiconductor oxide material, and
a material of the oxide layer and the semiconductor oxide material have different compositions.

5. The semiconductor storage device according to claim 4, wherein the semiconductor oxide material is indium-gallium-zinc oxide.

6. The semiconductor storage device according to claim 5, wherein the material of the oxide layer is one of indium-gallium-silicon oxide and gallium oxide.

7. The semiconductor storage device according to claim 4, wherein the material of the oxide layer is one of indium-gallium-silicon oxide and gallium oxide.

8. The semiconductor storage device according claim 1, further comprising:
a plurality of capacitors each connected to a corresponding drain electrode of the plurality of first semiconductor transistors.

9. The semiconductor storage device according to claim 1, wherein the side surface of the second wire on which the channel layer is disposed has a notched portion conforming to an outer peripheral shape of the channel layer.

10. A semiconductor storage device, comprising:
a first plurality of first wires extending in a first direction spaced from each other in a second direction intersecting the first direction;
a plurality of second wires extending in the second direction and spaced from each other in the first direction, the plurality of second wires being spaced from the first plurality of first wires in a third direction orthogonal to the first and second directions; and
a first plurality of channel layers extending in the third direction, each channel layer of the first plurality facing a corresponding first wire of the first plurality and connected to a corresponding second wire of the plurality of second wires through a first conductive layer, each channel layer of the first plurality intersecting the corresponding first wire at a position in a central portion of the corresponding first wire in the second direction and intersecting the corresponding second wire at a first outer edge of the corresponding second wire, each channel layer of the first plurality being on a first surface of the corresponding second wire facing the corresponding first wire in the third direction and overlapping the first outer edge to be on a side surface of the corresponding second wire facing in the first direction.

11. The semiconductor storage device according to claim 10, wherein
the first conductive layer is an oxide layer on the side surface of the corresponding second wire between the corresponding second wire and each channel layer and on the first surface of the corresponding second wire between the corresponding second wire and each channel layer.

12. The semiconductor storage device according to claim 10, wherein channel layers of the first plurality that are connected to a same second wire and adjacent to each other along the same second wire are on different side surfaces of the same second wire.

13. The semiconductor storage device according to claim 10, wherein
the first conductive layer is an oxide layer between the corresponding second wire and each channel layer,
each channel layer includes a semiconductor oxide material, and
a material of the oxide layer and the semiconductor oxide material have different compositions.

14. The semiconductor storage device according to claim 10, further comprising:
a second plurality of first wires extending in the first direction and spaced from the first plurality of first wires in the third direction; and
a second plurality of channel layers extending in the third direction, each channel layer of the second plurality facing a corresponding first wire of the second plurality and connected to a corresponding second wire of the plurality of second wires through a second conductive layer, wherein
the plurality of second wires are between the first plurality of first wires and the second plurality of first wires in the third direction, and
channel layers of the first and second pluralities that are connected to a same second wire are aligned with each other in the third direction.

15. A semiconductor storage device, comprising:
a first plurality of word lines extending in a first direction and spaced from each other in a second direction intersecting the first direction, the first plurality of word lines being at a first distance from a substrate in a third direction orthogonal to the first and second direction;
a plurality of bit lines extending in the second direction and spaced from each other in the first direction, the plurality of bit lines being at a second distance from the substrate in the third direction, the second distance being greater than the first distance;
a second plurality of word lines extending in the first direction and spaced from each other in the second direction, the second plurality of word lines being at a third distance from the substrate in the third direction, the third distance being greater than the second distance, the plurality of bit lines being between the first and second plurality of word lines in the third direction, word lines of the first and second pluralities being aligned with each other in the third direction;
a first plurality of channel layers extending in the third direction, a channel layer of the first plurality connected to a bit line of the plurality of bit lines through a first conductive layer and facing a word line of the first plurality, an upper end of the channel layer of the first plurality contacting a side surface of the bit line and a lower surface of the bit line facing the first plurality of word lines through the first conducive layer; and
a second plurality of channel layers extending in the third direction, a channel layer of the second plurality connected to a bit line of the plurality of bit lines through a second conductive layer and facing a word line of the second plurality, a lower end of the channel layer of the second plurality contacting a side surface of the bit line and an upper surface of the bit line facing the second plurality of word lines through the second conductive layer, wherein
the channel layer of the first plurality extends through a central portion of the word line of the first plurality,
the channel layer of the second plurality extends through a central portion of the word line of the second plurality,
a first capacitor is connected to a bottom electrode of a first transistor corresponding to one of the first plurality of channel layers in the third direction, and
a second capacitor is connected to a top electrode of a second transistor correspond to one of the second plurality of channel layers in the third direction.

16. A semiconductor storage device, comprising:
a plurality of first wires extending in a first direction;
a plurality of second wires extending in a second direction intersecting the first direction;
a plurality of first semiconductor transistors, one of the first semiconductor transistors including a gate electrode and a channel layer, the gate electrode connected to one of the first wires and one end of the channel layer connected to a first surface and a second surface of one of the second wires through a conductive layer, the first surface facing in a third direction intersecting the first and second directions and the second surface facing in a direction intersecting the third direction; and
a capacitor connected to a drain electrode of said one of the first semiconductor transistors.

17. The semiconductor storage device according claim 16, wherein
the channel layer includes a semiconductor oxide material.

18. The semiconductor storage device according claim 17, wherein
the conductive layer is an oxide layer between the one of the second wires and the channel layer, and
a material of the oxide layer and the semiconductor oxide material have different compositions.

19. The semiconductor storage device according to claim 16, wherein the second surface to which the one end of the channel layer is connected has a notched portion conforming to an outer peripheral shape of the channel layer.

* * * * *